United States Patent [19]

Lin

[11] Patent Number: 5,619,448
[45] Date of Patent: Apr. 8, 1997

[54] NON-VOLATILE MEMORY DEVICE AND APPARATUS FOR READING A NON-VOLATILE MEMORY ARRAY

[75] Inventor: Yi-Pin Lin, Hsinchu, Taiwan

[73] Assignee: Myson Technology, Inc., Hsinchu, Taiwan

[21] Appl. No.: 615,402

[22] Filed: Mar. 14, 1996

[51] Int. Cl.$^6$ ................................................ G11C 7/00
[52] U.S. Cl. ............................ 365/185.03; 365/185.17; 365/185.23; 365/230.06
[58] Field of Search .................... 365/185.03, 185.17, 365/185.23, 185.24, 230.06

[56] References Cited

U.S. PATENT DOCUMENTS

| | | | |
|---|---|---|---|
| 5,172,338 | 12/1992 | Menhrotra et al. | 365/185.03 |
| 5,293,560 | 3/1994 | Harari | 365/185.03 |
| 5,428,569 | 6/1995 | Kato et al. | 365/185.17 |

Primary Examiner—David C. Nelms
Assistant Examiner—Vu A. Le
Attorney, Agent, or Firm—Christensen O'Connor Johnson & Kindness PLLC

[57] ABSTRACT

A non-volatile memory array includes a plurality of memory cells. Each of the memory cells stores two-bits of data therein and has a threshold voltage corresponding to the data bits stored therein. A voltage providing unit provides a first test voltage to an addressed one of the memory cells. A sensing unit senses whether the addressed one of the memory cells is in a conducting state after the first test voltage has been applied thereto to determine a first bit of data stored therein. When the first bit of data stored in the addressed one of the memory cells is 0, the voltage providing unit provides a second test voltage and the sensing unit senses whether the addressed one of the memory cells is in the conducting state after the second test voltage has been applied thereto to determine a second bit of data stored therein. Otherwise, the voltage providing unit provides a third test voltage and the sensing unit senses whether the addressed one of the memory cells is in the conducting state after the third test voltage has been applied thereto to determine a second bit of data stored therein.

6 Claims, 9 Drawing Sheets

| ADDRESSED MEMORY CELL | GATE VOLTAGE | THRESHOLD VOLTAGE | STORED DATA BIT | CURRENT |
|---|---|---|---|---|
| NO | 0V | 0.7V | "0" | NIL |
| NO | 0V | 5.2V | "1" | NIL |
| YES | 3.0V | 0.7V | "0" | DETECTED |
| YES | 3.0V | 5.2V | "1" | NIL |

| ADDRESSED MEMORY CELL | GATE VOLTAGE | THRESHOLD VOLTAGE | STORED DATA BIT | CURRENT |
|---|---|---|---|---|
| NO | 4.5V | 2.0V | "0" | DETECTED |
| NO | 4.5V | 0.7V | "1" | DETECTED |
| YES | 0V | 2.0V | "0" | DETECTED |
| YES | 0V | 0.7V | "1" | NIL |

| ADDRESSED MEMORY CELL | GATE VOLTAGE | THRESHOLD VOLTAGE | STORED DATA BIT | CURRENT |
|---|---|---|---|---|
| NO | 0V | 0.7V | "00" | NIL |
| NO | 0V | 2.2V | "01" | NIL |
| NO | 0V | 3.7V | "10" | NIL |
| NO | 0V | 5.2V | "11" | NIL |
| YES | 4.5V | 0.7V | "00" | LARGE |
| YES | 4.5V | 2.2V | "01" | MEDIUM |
| YES | 4.5V | 3.7V | "10" | SMALL |
| YES | 4.5V | 5.2V | "11" | NIL |

| ADDRESSED MEMORY CELL | GATE VOLTAGE | THRESHOLD VOLTAGE | STORED DATA BIT | CURRENT |
|---|---|---|---|---|
| NO | 4.5V | −2.0V | "00" | VARIABLE |
| NO | 4.5V | 0.7V | "01" | VARIABLE |
| NO | 4.5V | 2.2V | "10" | VARIABLE |
| NO | 4.5V | 3.7V | "11" | VARIABLE |
| YES | 3.0V | −2.0V | "00" | VARIABLE |
| YES | 3.0V | 0.7V | "01" | VARIABLE |
| YES | 3.0V | 2.2V | "10" | VARIABLE |
| YES | 3.0V | 3.7V | "11" | NIL |

| ADDRESSED MEMORY CELL | GATE VOLTAGE | THRESHOLD VOLTAGE | STORED DATA BIT | CURRENT |
|---|---|---|---|---|
| NO | 0V;0V | 0.7V | "00" | NIL;NIL |
| NO | 0V;0V | 2.2V | "01" | NIL:NIL |
| NO | 0V;0V | 3.7V | "10" | NIL:NIL |
| NO | 0V;0V | 5.2V | "11" | NIL;NIL |
| YES | 3.0V;1.5V | 0.7V | "00" | DETECTED; DETECTED |
| YES | 3.0V;1.5V | 2.2V | "01" | DETECTED; NIL |
| YES | 3.0V;4.5V | 3.7V | "10" | NIL; DETECTED |
| YES | 3.0V;4.5V | 5.2V | "11" | NIL:NIL |
F I G. 10
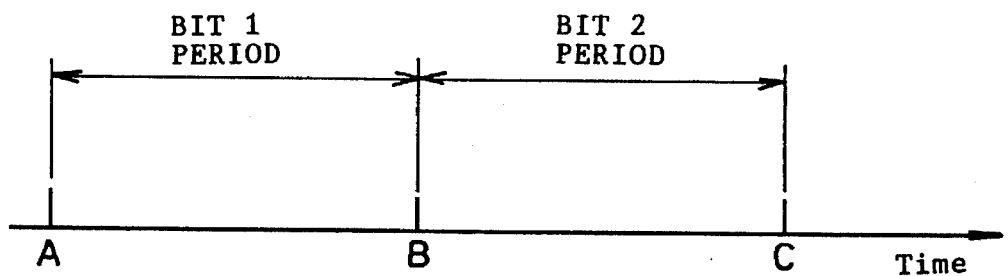
F I G. 11

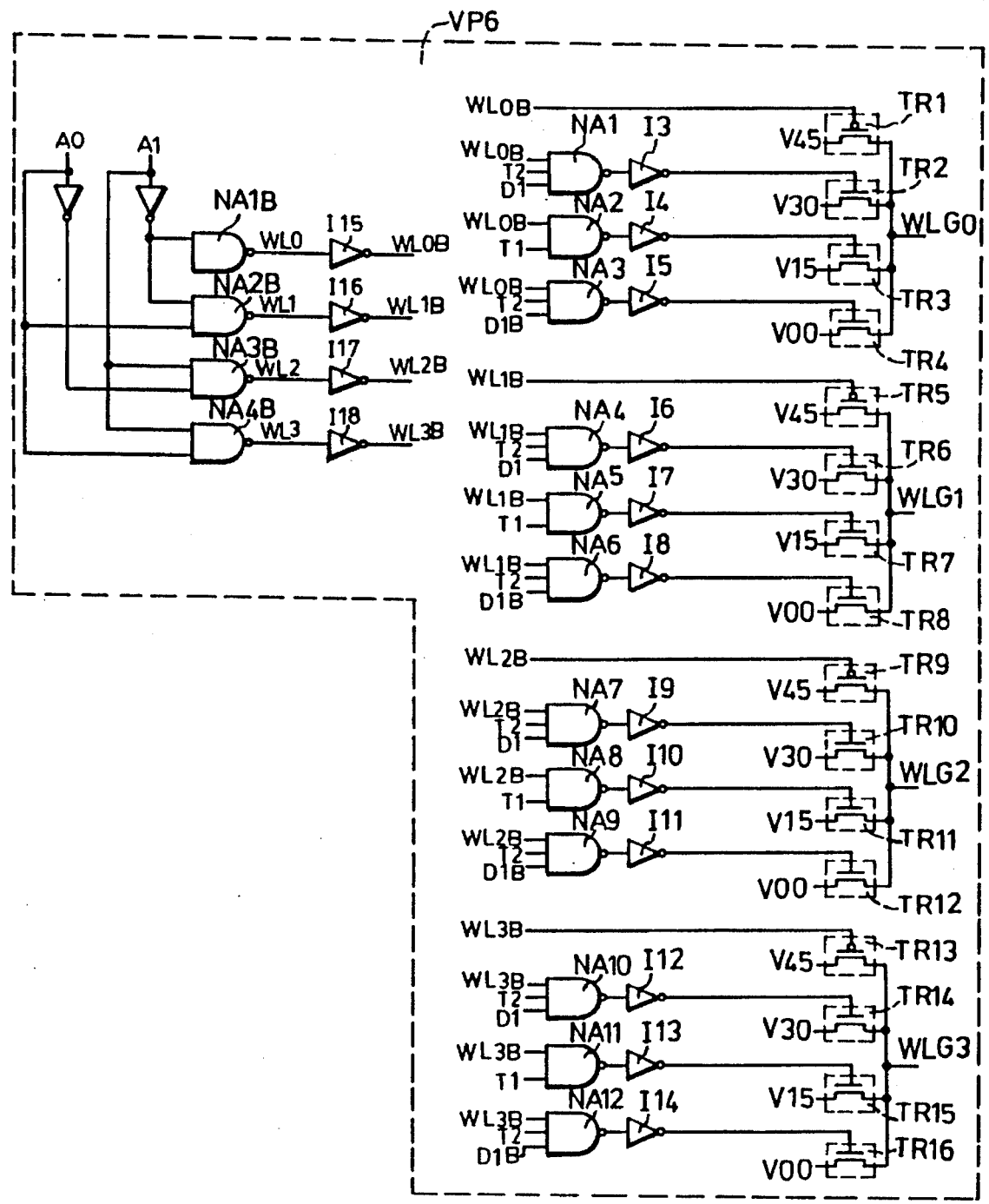
F I G. 12A

| ADDRESSED MEMORY CELL | GATE VOLTAGE | THRESHOLD VOLTAGE | STORED DATA BIT | CURRENT |
|---|---|---|---|---|
| NO | 4.5V;4.5V | _2.0V | "00" | DETECTED; DETECTED |
| NO | 4.5V;4.5V | 0.7V | "01" | DETECTED; DETECTED |
| NO | 4.5V;4.5V | 2.2V | "10" | DETECTED; DETECTED |
| NO | 4.5V;4.5V | 3.7V | "11" | DETECTED; DETECTED |
| YES | 1.5V;0V | _2.0V | "00" | DETECTED; DETECTED |
| YES | 1.5V;0V | 0.7V | "01" | DETECTED; NIL |
| YES | 1.5V;3.0V | 2.2V | "10" | NIL; DETECTED |
| YES | 1.5V;3.0V | 3.7V | "11" | NIL;NIL |

NON-VOLATILE MEMORY DEVICE AND APPARATUS FOR READING A NON-VOLATILE MEMORY ARRAY

BACKGROUND OF THE INVENTION

1. Field Of The Invention

This invention relates to a non-volatile memory device, more particularly to a non-volatile memory device and an apparatus for reading a non-volatile memory array of the non-volatile memory device.

2. Description Of The Related Art

Mask Read Only Memory (MROM) is a popular non-volatile memory device in circuit design. Data is written into the memory cells of the memory device through a mask in the memory manufacturing process after the data is encoded. The data that is written into the memory cells of the memory device cannot be erased for rewriting of the memory device after the manufacturing process has been completed. Generally, MROM is used in storing large amounts of data, such as in television game programs and electronic dictionaries. Therefore, there is a need to increase the storage density of a memory cell.

Referring to FIG. 1, a conventional non-volatile memory device includes a non-volatile memory array (A1). The memory array (A1) includes a plurality of memory cells (C1) which are connected in parallel. Each of the memory cells (C1) has one bit of data stored therein and is formed from one of two different transistors. A voltage providing means (VP1) includes four NOR gates (G11 to G14) and two inverters (G9 and G10). Each of the NOR gates (G11 to G14) has an output terminal connected electrically to the gate of a respective one of the memory cells (C1). The first input terminals of two of the NOR gates (G11 and G12) are connected electrically to a first address line (A1), while the first input terminals of another two of the NOR gates (G13 and G14) are connected electrically to the first address line (A1) via the inverter (G10). The second input terminals of two of the NOR gates (G11 and G13) are connected electrically to a second address line (A0), while the second input terminals of another two of the NOR gates (G12 and G14) are connected electrically to the second address line (A0) via the inverter (G9). To read a memory cell (C1), the memory cell (C1) is addressed. At this time, the addressed memory cell (C1) is turned on, while the non-addressed memory cells (C1) are turned off. The drains of all of the memory cells (C1) are connected electrically to a sensing means (S1) for sensing whether the addressed memory cell (C1) is in a conducting state, that is, whether the addressed memory cell (C1) has current flowing therethrough after a gate voltage has been provided thereto. The sensing means (S1) consists of two inverters (G15 and G16) connected in series, and has an input terminal connected electrically to the drains of the memory cells (C1) and an output terminal connected electrically to a bit line (BIT) for the transmission of the data bit read from the addressed memory cell (C1). The sources of all of the memory cells (C1) are grounded. Some of the memory cells (C1) have a first threshold voltage, such as 0.7 v, that corresponds to data bit 0. The other memory cells (C1) have a second threshold voltage, such as 5.2 v, that is greater than the first threshold voltage and that corresponds to data bit 1.

Referring now to FIGS. 1 and 2, in operation, the voltage providing means (VP1) is configured to provide a test voltage between the first and second threshold voltages, such as 3 v, to the addressed memory cell (C1). The sensing means (S1) senses whether the addressed memory cell (C1) is in the conducting state after the test voltage has been applied thereto so as to determine the corresponding data bit.

Referring to FIG. 3, a second conventional non-volatile memory device includes a second memory array (A2). Unlike the memory array (A1) of FIG. 1, the memory cells (C2) of the memory array (A2) of FIG. 2 are connected in series. The voltage providing means (VP2) includes four NAND gates (G3 to G6) and two inverters (G1 and G2). Each of the NAND gates (G3 to G6) has an output terminal connected electrically to the gate of a respective one of the memory cells (C2). The first input terminals of two of the NAND gates (G3 and G4) are connected electrically to the first address line (A1) via the inverter (G2), while the first input terminals of another two of the NAND gates (G5 and G6) are connected electrically to the first address line (A1). The second input terminals of two of the NAND gates (G3 and G5) are connected electrically to the second address line (A0) via the inverter (G1), while the second input terminals of another two of the NAND gates (G4 and G6) are connected electrically to the second address line (A0). As with the previous example, to read a memory cell (C2), the memory cell (C2) is addressed. The addressed memory cell (C2) is turned off, while the non-addressed memory cells (C2) are turned on. Some of the memory cells (C2) have a first threshold voltage, such as −2.0 v, that corresponds to data bit 0. The other memory cells (C2) have a second threshold voltage, such as 0.7 v, that is greater than the first threshold voltage and that corresponds to data bit 1.

Referring now to FIGS. 3 and 4, in operation, the voltage providing means (VP2) is configured to provide a test voltage between the first and second threshold voltages, such as 0 v, to the addressed memory cell (C2). The sensing means (S2) senses whether the addressed memory cell (C2) is in the conducting state after the test voltage has been applied thereto so as to determine the corresponding data bit.

Referring to FIG. 5, in order to increase the storage density of a memory cell, a third conventional non-volatile memory device has been developed. The structures of the memory array (A3) and voltage providing means (VP3) of FIG. 3 are similar to those of the memory array (A1) and the voltage providing means (VP1) of FIG. 1. However, each of the memory cells (C3) stores two-bits of data therein and is formed from one of first, second, third and fourth transistors. The first transistor has a first threshold voltage, such as 0.7 v, and corresponds to data bits 00. The second transistor has a second threshold voltage, such as 2.2 v, greater than the first threshold voltage and corresponds to data bits 01. The third transistor has a third threshold voltage, such as 3.7 v, greater than the second threshold voltage and corresponds to data bits 10. The fourth transistor has a fourth threshold voltage, such as 5.2 v, greater than the third threshold voltage and corresponds to data bits 11.

The sensing means (S3) includes first to sixth inverters (G29 to G34) and first to sixth NAND gates (G35 to G40). The first and second inverters (G29 and G30) are connected in series. The third and fourth inverters (G31 and G32) are connected in series. The fifth and sixth inverters (G33 and G34) are connected in series. The input terminals of the first, third and fifth inverters (G29, G31 and G33) are connected electrically to the drains of the memory cells (C3). The first, second and third input terminals of the first and fourth NAND gates (G35 and G38) are connected electrically to the output terminals of the second, fourth and sixth inverters (G30, G32 and G34), respectively. The first input terminals of the second and fifth NAND gates (G36 and G39) are connected electrically to the output terminal of the first inverter (G29). The second input terminal of the second NAND gate (G36) is connected electrically to the output terminal of the fourth inverter (G32). The second input terminal of the fifth NAND gate (G39) is connected electrically to the output terminal of the third inverter (G31). The third input terminals of the second and fifth NAND gates (G36 and G39) are connected electrically to the output terminal of the sixth inverter (G34). The first and second input terminals of the third NAND gate (G37) are connected electrically and respectively to the output terminals of the first and second NAND gates (G35 and G36), while the first and second input terminals of the sixth NAND gate (G40) are connected electrically and respectively to the output terminals of the fourth and fifth NAND gates (G38 and G39). The output terminal of the sixth NAND gate (G40) is connected electrically to a first bit line (BIT1) for the transmission of a first one of the data bits of the addressed one of the memory cells (C3), while the output terminal of the third NAND gate (G37) is connected electrically to a second bit line (BIT2) for the transmission of a second one of the data bits of the addressed one of the memory cells (C3).

It should be noted that, the first inverter (G29) has a first trigger voltage, the third inverter (G31) has a second trigger voltage greater than the first trigger voltage of the first inverter (G29), and the fifth inverter (G33) has a third trigger voltage greater than the second trigger voltage of the third inverter (G31). Therefore, when the voltage level of the input signal presented at the input terminals of the first, third and fifth inverters (G29, G31 and G33) is located between the first and second trigger voltages, the first inverter (G29) has a low state output, while the third and fifth inverters (G31 and G33) have high state outputs.

Referring now to FIGS. 5 and 6, in operation, the voltage providing means (VP3) provides a test voltage between the third and fourth threshold voltages, such as 4.5 v, to the addressed one of the memory cells (C3). The sensing means (S3) senses whether the addressed one of the memory cells (C3) is in the conducting state after the test voltage has been applied thereto, and detects the value of the current flowing therethrough. If the current value is within a first predetermined range, the data bit 00 corresponding to the addressed one of the memory cells (C3) is detected. If the current value is within a second predetermined range small than the first predetermined range, the data bit 10 corresponding to the addressed one of the memory cells (C3) is detected. If the current value is within a third predetermined range between the first and second predetermined ranges, the data bit 01 corresponding to the addressed one of the memory cells (C3) is detected. If no current flows through the addressed one of the memory cells (C3), the data bit 11 corresponding to the addressed one of the memory cells (C3) is detected.

Since the sensing means (S3) of FIG. 3 must be capable of detecting the value of the current flowing through the memory cells (C3), the structure thereof is more complicated than that of the sensing means (S1,S2) of FIGS. 1 and 2, thereby resulting in a higher manufacturing cost.

Referring to FIGS. 7 and 8, a fourth memory array (A4) is shown. However, the value of the current flowing through the addressed one of the memory cells (C4) is indeterminated since the memory cells (C4) are connected in series. Therefore, the memory array (A4) of FIG. 7 is unusable because the sensing means (S4) cannot be defined.

SUMMARY OF THE INVENTION

Therefore, the main objective of the present invention is to provide a non-volatile memory device and an apparatus for reading a non-volatile memory array in the non-volatile memory device, the memory device having a high storage density and the apparatus having a simpler construction as compared to the aforementioned prior art.

According to one aspect of the present invention, an apparatus is provided for reading a non-volatile memory array which includes a plurality of memory cells. Each of the memory cells stores two-bits of data therein and is formed from one of first, second, third and fourth transistors. The first transistor has a first threshold voltage and corresponds to data bits 00. The second transistor has a second threshold voltage greater than the first threshold voltage and corresponds to data bits 01. The third transistor has a third threshold voltage greater than the second threshold voltage and corresponds to data bits 10. The fourth transistor has a fourth threshold voltage greater than the third threshold voltage and corresponds to data bits 11. The apparatus includes: voltage providing means, adapted to be connected to the memory cells, for providing a first test voltage between the second and third threshold voltages to an addressed one of the memory cells; and sensing means, adapted to be connected to the memory cells and to the voltage providing means, for sensing whether the addressed one of the memory cells is in a conducting state after the first test voltage has been applied thereto to determine a first bit of data stored therein. When the first bit of data stored in the addressed one of the memory cells is 0, the sensing means controls the voltage providing means to provide a second test voltage between the first and second threshold voltages and senses whether the addressed one of the memory cells is in the conducting state after the second test voltage has been applied thereto to determine a second bit of data stored therein. When the first bit of data stored in the addressed one of the memory cells is 1, the sensing means controls the voltage providing means to provide a third test voltage between the third and fourth threshold voltages and senses whether the addressed one of the memory cells is in the conducting state after the third test voltage has been applied thereto to determine a second bit of data stored therein.

According to a second aspect of the present invention, a non-volatile memory device includes a non-volatile memory array having a plurality of memory cells. Each of the memory cells stores two-bits of data therein and is formed from one of first, second, third and fourth transistors. The first transistor has a first threshold voltage and corresponds to data bits 00. The second transistor has a second threshold voltage greater than the first threshold voltage and corresponds to data bits 01. The third transistor has a third threshold voltage greater than the second threshold voltage and corresponds to data bits 10. The fourth transistor has a fourth threshold voltage greater than the third threshold voltage and corresponds to data bits 11. A reading apparatus includes: voltage providing means, adapted to be connected to the memory cells, for providing a first test voltage between the second and third threshold voltages to an addressed one of the memory cells; and sensing means, adapted to be connected to the memory cells and to the voltage providing means, for sensing whether the addressed one of the memory cells is in a conducting state after the first test voltage has been applied thereto to determine a first bit of data stored therein. When the first bit of data stored in the addressed one of the memory cells is 0, the sensing means controls the voltage providing means to provide a second test voltage between the first and second threshold voltages and senses whether the addressed one of the memory cells is in the conducting state after the second test voltage has been applied thereto to determine a second bit of data stored therein. When the first bit of data stored in the addressed one of the memory cells is 1, the sensing means controls the voltage providing means to provide a third test voltage between the third and fourth threshold voltages and senses whether the addressed one of the memory cells is in the conducting state after the third test voltage has been applied thereto to determine a second bit of data stored therein.

BRIEF DESCRIPTION OF THE DRAWINGS

Other features and advantages of the present invention will become apparent in the following detailed description of the preferred embodiments, with reference to the accompanying drawings, of which:

FIG. 10 is a table illustrating the characteristics of the transistors employed in the memory device of FIG. 9 when the latter is operated;

FIG. 11 is a timing diagram illustrating the reading periods of the first preferred embodiment of the present invention;

FIGS. 12A and 12B are schematic circuit diagrams showing the second preferred embodiment of a non-volatile memory device according to the present invention; and FIG. 13 is a table illustrating the characteristics of the transistors employed in the memory device of FIG. 12 when the latter is operated.

DETAILED DESCRIPTION OF THE PREFERRED EMBODIMENTS

Figures 1, 2:
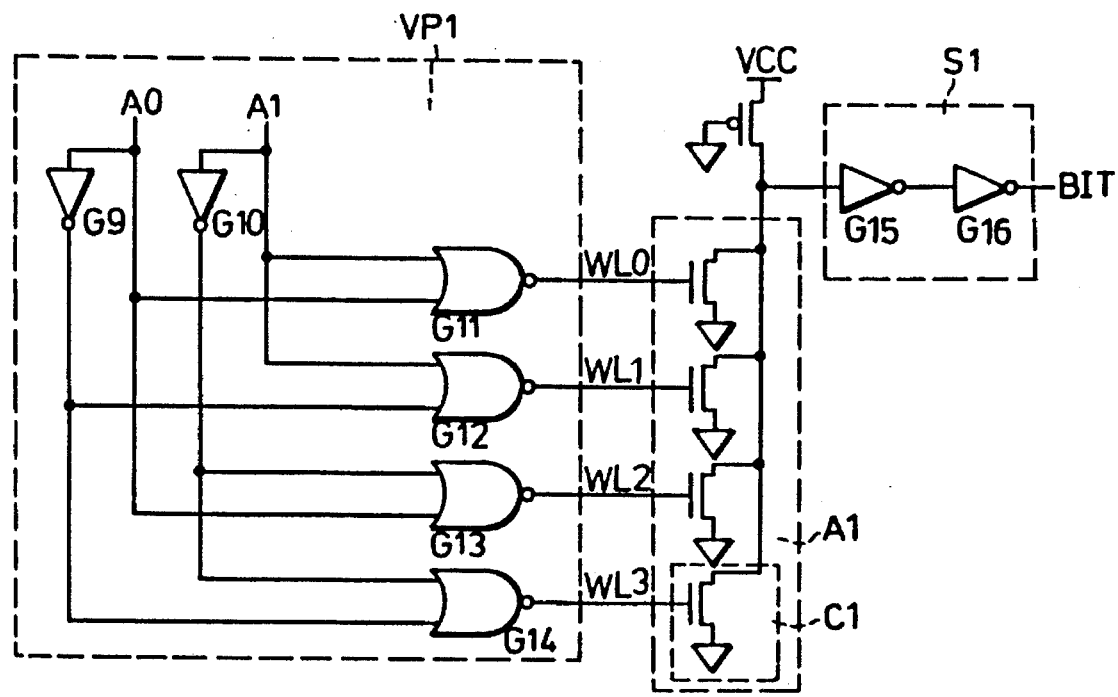
FIG. 1 is a schematic circuit diagram showing a conventional non-volatile memory device.
FIG. 2 is a table illustrating the characteristics of the transistors employed in the memory device of FIG. 1 when the latter is operated.

Before the present invention is described in greater detail, it should be noted that like elements are indicated by the same reference numerals throughout the disclosure.

Figures 8, 9B:
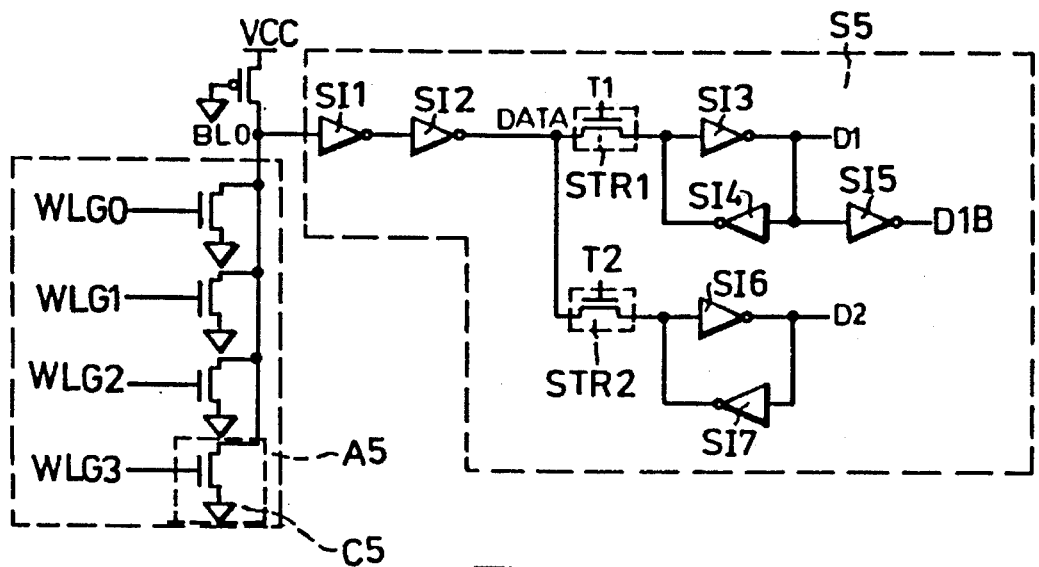
FIG. 8 is a table illustrating the characteristics of the transistors employed in the memory device of FIG. 7 when the latter is operated.
FIGS. 9A and 9B are schematic circuit diagrams showing the first preferred embodiment of a non-volatile memory device according to the present invention.
Figure 9A:
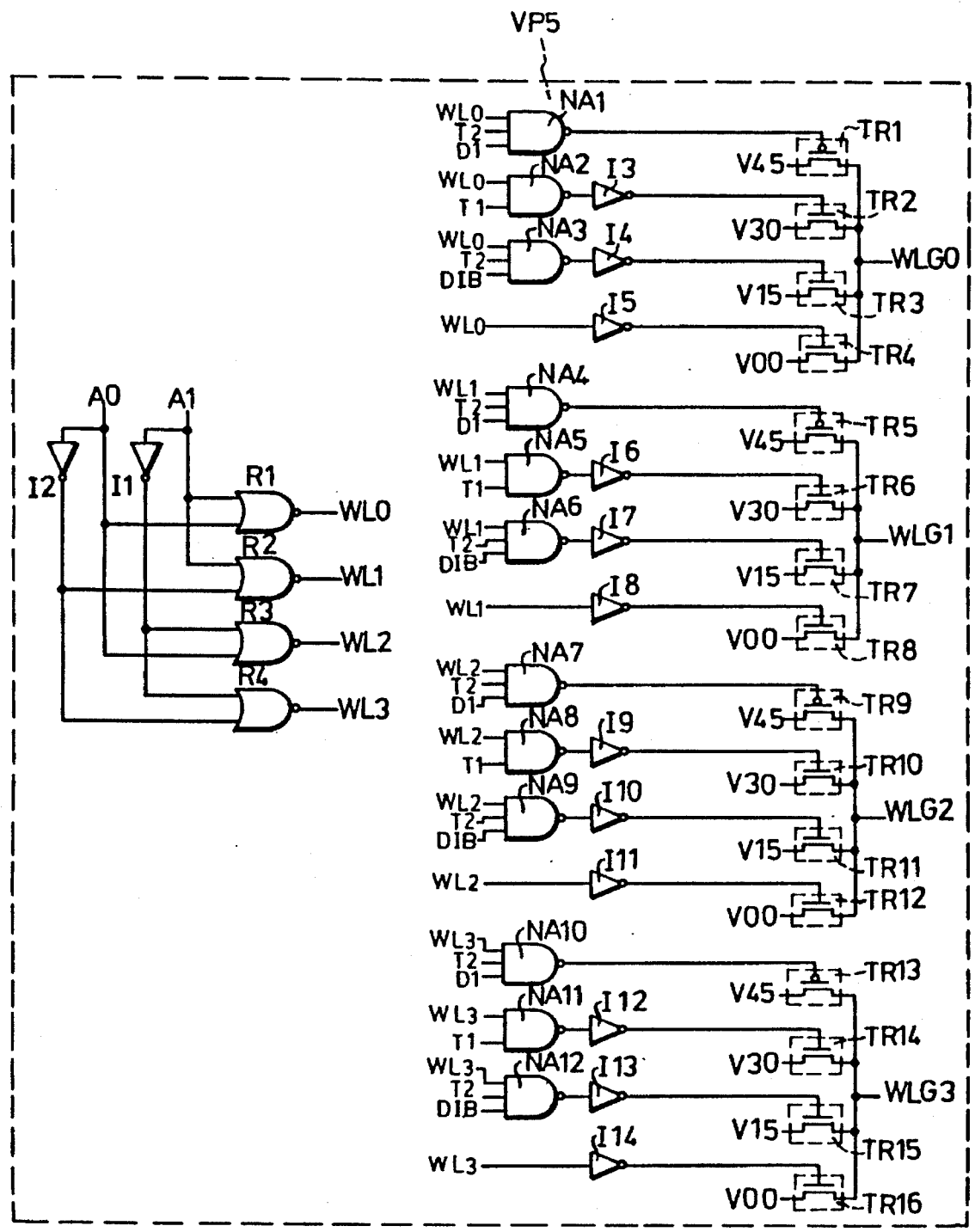

Referring to FIGS. 9A and 9B, the first preferred embodiment of a non-volatile memory device according to the present invention is shown to include a non-volatile memory array (A5) and a reading apparatus.

The memory array (A5) includes a plurality of memory cells (C5) which are connected in parallel. Each of the memory cells (C5) stores two-bits of data therein and is formed from one of first, second, third and fourth transistors. The first transistor has a first threshold voltage, such as 0.7 v, and corresponds to data bits 00. The second transistor has a second threshold voltage, such as 2.2 v, greater than the first threshold voltage and corresponds to data bits 01. The third transistor has a third threshold voltage, such as 3.7 v, greater than the second threshold voltage and corresponds to data bits 10. The fourth transistor has a fourth threshold voltage, such as 5.2 v, greater than the third threshold voltage and corresponds to data bits 11.

The reading apparatus includes voltage providing means (VP5) and sensing means (S5).

The voltage providing means (VP5) includes fourteen inverters (I1 to I14), four NOR gates (R1 to R4), twelve NAND gates (NA1 to NA 12) and sixteen field effect transistors (TR1 to TR16). The first input terminals of the first and second NOR gates (R1 and R2) are connected electrically to a first address line (A1), while the first input terminals of the third and fourth NOR gates (R3 and R4) are connected electrically to the first address line (A1) via the first inverter (I1). The second input terminals of the first and third NOR gates (R1 and R3) are connected electrically to a second address line (A0), while the second input terminals of the second and fourth NOR gates (R2 and R4) are connected electrically to the second address line (A0) via the second inverter (I2).

The first NAND gate (NA1) has a first input terminal connected electrically to an output terminal of the first NOR gate (R1), a second input terminal and a third input terminal. The second NAND gate (NA2) has a first input terminal connected electrically to the output terminal of the first NOR gate (R1) and a second input terminal. The third NAND gate (NA3) has a first input terminal connected electrically to the output terminal of the first NOR gate (R1), a second input terminal and a third input terminal. Since the structure of the fourth, sixth, seventh, ninth, tenth and twelfth NAND gates (NA4,NA6,NA7,NA9,NA10,NA12) are similar to those of the first and third NAND gates (NA1 and NA3), and since the structures of the fifth, eighth and eleventh NAND gates (NA5,NA8,NA11) are similar to that of the second NAND gate (NA2), a detailed description thereof is thus omitted herein. However, the first input terminal of the fourth, fifth and sixth NAND gates (NA4,NA5,NA6) are connected electrically to the output terminal of the second NOR gate (R2), the first input terminal of the seventh, eighth and ninth NAND gates (NA7,NA8,NA9) are connected electrically to the output terminal of the third NOR gate (R3), and the first input terminal of the tenth, eleventh and twelfth NAND gates (NA10,NA11,NA12) are connected electrically to the output terminal of the fourth NOR gate (R4).

The first transistor (TR1) has a gate connected electrically to the output terminal of the first NAND gate (NA1), a drain connected to a third power source (V45) which generates a third test voltage, such as 4.5 v, and a source. The second transistor (TR2) has a gate connected electrically to the output terminal of the second NAND gate (NA2) via the third inverter (I3), a drain connected to a first power source (V30) which generates a first test voltage, such as 3 v, and a source. The third transistor (TR3) has a gate connected electrically to the output terminal of the third NAND gate (NA3) via the fourth inverter (I4), a drain connected to a second power source (V15) which generates a second test voltage, such as 1.5 v, and a source. The fourth transistor (TR4) has a gate connected electrically to the output terminal of the first NOR gate (R1) via the fifth inverter (I5), a drain connected to a fourth power source (V00) which generates a fourth test voltage, such as 0 v, and a source. The sources of the first to fourth transistors (TR1 to TR4) are connected together. Since the structure of the fifth to eighth transistors (TR5 to TR8), the ninth to twelfth transistors (TR9 to TR12) and the thirteenth to sixteenth transistors (TR13 to TR16) are similar to those of the first to fourth transistors (TR1 to TR4), a detailed description thereof is thus omitted herein. However, the gate of the fifth transistor (TR5) is connected electrically to the output terminal of the fourth NAND gate (NA4), the gate of the sixth transistor (TR6) is connected electrically to the output terminal of the fifth NAND gate (NA5) via the sixth inverter (I6), the gate of the seventh transistor (TR7) is connected electrically to the output terminal of the sixth NAND gate (NA6) via the seventh inverter (I7), the gate of the eighth transistor (TR8) is connected electrically to the output terminal of the second NOR gate (R2) via the eighth inverter (I8), the gate of the ninth transistor (TR9) is connected electrically to the output terminal of the seventh NAND gate (NA7), the gate of the tenth transistor (TR10) is connected electrically to the output terminal of the eighth NAND gate (NA8) via the ninth inverter (I9), the gate of the eleventh transistor (TR11) is connected electrically to the output terminal of the ninth NAND gate (NA9) via the eighth inverter (I8), the gate of the twelfth transistor (TR12) is connected electrically to the output terminal of the third NOR gate (R3), the gate of the thirteenth transistor (TR13) is connected electrically to the output terminal of the tenth NAND gate (NA10), the gate of the fourteenth transistor (TR14) is connected electrically to the output terminal of the eleventh NAND gate (NA11) via the twelfth inverter (I12), the gate of the fifteenth transistor (TR15) is connected electrically to the output terminal of the twelfth NAND gate (NA12) via the thirteenth inverter (I13), and the gate of the sixteenth transistor (TR16) is connected electrically to the output terminal of the fourth NOR gate (R4) via the fourteenth inverter (I14).

It should be noted that the first, fifth, ninth and thirteen transistors (TR1,TR5,TR9,TR13) are P-type field effect transistors, while the remaining ones of the transistors are N-type field effect transistors.

The sensing means (S5) includes first to seventh inverters (SI1 to SI7) and two field effect transistors (STR1 and STR2). The first inverter (SI1) has an input terminal connected electrically to the drains of the memory cells (C5). The second inverter (SI2) has an input terminal connected electrically to an output terminal of the first inverter (SI1). The transistor (STR1) has a source connected electrically to an output terminal of the second inverter (SI2), a drain connected electrically to an input terminal of the third inverter (SI3) and to an output terminal of the fourth inverter (SI4), and a gate connected electrically to the second input terminals of the second, fifth, eighth and eleventh NAND gates (NA2,NA5,NA8,NA11). The third inverter (SI3) has an output terminal connected electrically to a first bit line (D1) for the transmission of a first data bit, to an input terminal of the fourth inverter (SI4) and to an input of the fifth inverter (SI5). The fifth inverter (SI5) has an output terminal connected electrically to the third input terminals of the third, sixth, ninth and twelfth NAND gates (NA3,NA6, NA9,NA12). The transistor (STR2) has a drain connected electrically to an input terminal of the sixth inverter (SI6) and to an output terminal of the seventh inverter (SI7), and a gate connected electrically to the second input terminals of the first, third, fourth, sixth, seventh, ninth, tenth and twelfth NAND gates (NA1,NA3,NA4,NA6,NA7,NA9,NA10, NA12). The output terminal of the sixth inverter (SI6) is connected electrically to a second bit line (D2) for the transmission of a second data bit, and to an output terminal of the seventh inverter (SI7).

Referring now to FIGS. 9A, 9B, 10 and 11, in operation, the voltage providing means (VP5) provides a first test voltage between the second and third threshold voltages, such as 3 v, to an addressed one of the memory cells (C5) during the first half of a read cycle. The sensing means (S5) senses whether the addressed one of the memory cells (C5) is in a conducting state after the first test voltage has been applied thereto to determine a first bit of data stored therein. When the first bit of data stored in the addressed one of the memory cells (C5) is 0, the sensing means (S5) controls the voltage providing means (VP5) to provide a second test voltage between the first and second threshold voltages, such as 1.5 v, during the second half of the read cycle and senses whether the addressed one of the memory cells (C5) is in the conducting state after the second test voltage has been applied thereto to determine a second bit of data stored therein. When the first bit of data stored in the addressed one of the memory cells (C5) is 1, the sensing means (S5) controls the voltage providing means (VP5) to provide a third test voltage between the third and fourth threshold voltages, such as 4.5 v, during the second half of the read cycle and senses whether the addressed one of the memory cells (C5) is in the conducting state after the third test voltage has been applied thereto to determine a second bit of data stored therein.

It should be appreciated that the voltage providing means (VP5) provides the fourth test voltage to the non-addressed ones of the memory cells (C5), thereby turning off the non-addressed ones of the memory cells (C5).

Figures 12B, 13:
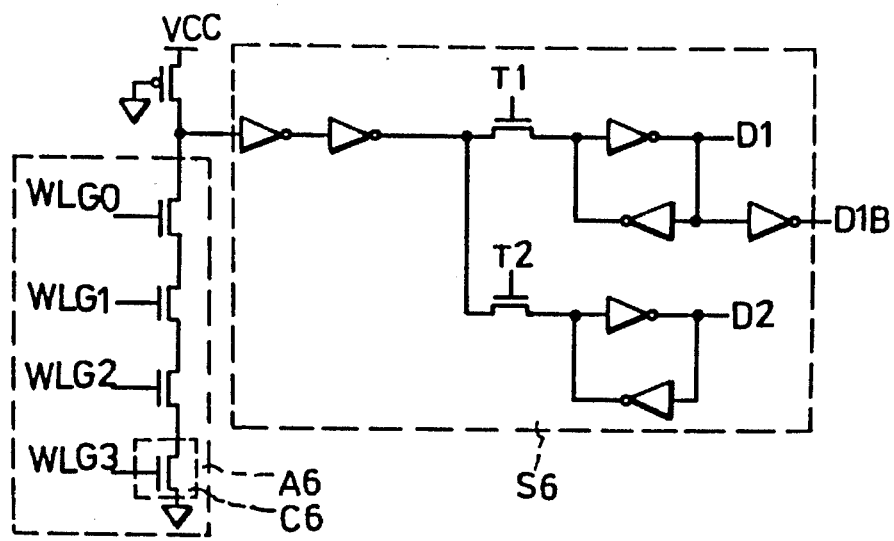

Referring to FIGS. 12A and 12B, a second preferred embodiment of the present invention is shown. Unlike the first embodiment, the memory cells (C6) of the second embodiment are connected in series, and the NOR gates (R1 to R4) are replaced by NAND gates (NA1B to NA4B). Each of the memory cells (C6) stores two-bits of data therein and is formed from one of first, second, third and fourth transistors. The first transistor has a first threshold voltage, such as −2.0 v, and corresponds to data bits 00. The second transistor has a second threshold voltage, such as 0.7 v, greater than the first threshold voltage and corresponds to data bits 01. The third transistor has a third threshold voltage, such as 2.2 v, greater than the second threshold voltage and corresponds to data bits 10. The fourth transistor has a fourth threshold voltage, such as 3.7 v, greater than the third threshold voltage and corresponds to data bits 11.

The voltage providing means (VP6) further includes four inverters (I15 to I18). The input terminal of the inverter (I15) is connected electrically to the output terminal of the NAND gate (NA1B), while the output terminal of the same is connected electrically to the gate of the first transistor (TR1), and to the first input terminals of the first, second and third NAND gates (NA1,NA2,NA3). The output terminal of each of the first, second and third NAND gates (NA1,NA2,NA3) is connected electrically to the gate of a respective one of the second, third and fourth transistors (TR2,TR3,TR4) via an inverter (I3,I4,I5). Similarly, the input terminal of the inverter (I16) is connected electrically to the output terminal of the NAND gate (NA2B), while the output terminal of the same is connected electrically to the gate of the fifth transistor (TR5), and to the first input terminals of the fourth, fifth and sixth NAND gates (NA4,NA5,NA6). The output terminal of each of the fourth, fifth and sixth NAND gates (NA4,NA5,NA6) is connected electrically to the gate of a respective one of the sixth, seventh and eighth transistors (TR6,TR7,TR8) via an inverter (I6,I7,I8). The input terminal of the inverter (I17) is connected electrically to the output terminal of the NAND gate (NA3B), while the output terminal of the same is connected electrically to the gate of the ninth transistor (TR9), and to the first input terminals of the seventh, eighth and ninth NAND gates (NA7,NA8, NA9). The output terminal of each of the seventh, eighth and ninth NAND gates (NA7,NA8,NA9) is connected electrically to the gate of a respective one of the tenth, eleventh and twelfth transistors (TR10,TR11,TR12) via an inverter (I9, I10,I11). Lastly, the input terminal of the inverter (I18) is connected electrically to the output terminal of the NAND gate (NA4B), while the output terminal of the same is connected electrically to the gate of the thirteenth transistor (TR13), and to the first input terminals of the tenth, eleventh and twelfth NAND gates (NA10,NA11,NA12). The output terminal of each of the tenth, eleventh and twelfth NAND gates (NA10,NA11,NA12) is connected electrically to the gate of a respective one of the fourteenth, fifteenth and sixteenth transistors (TR14,TR15,TR16) via an inverter (I12,I13,I14).

Referring now to FIGS. 12A, 12B and 13, in operation, the voltage providing means (VP6) provides a first test voltage between the second and third threshold voltages, such as 1.5 v, to an addressed one of the memory cells (C6) during the first half of a read cycle. The sensing means (S6) senses whether the addressed one of the memory cells (C6) is in a conducting state after the first test voltage has been applied thereto to determine a first bit of data stored therein. When the first bit of data stored in the addressed one of the memory cells (C6) is 0, the sensing means (S6) controls the voltage providing means (VP6) to provide a second test voltage between the first and second threshold voltages, such as 0 v, during a second half of the read cycle and senses whether the addressed one of the memory cells (C6) is in the conducting state after the second test voltage has been applied thereto to determine a second bit of data stored therein. When the first bit of data stored in the addressed one of the memory cells (C6) is 1, the sensing means (S6) controls the voltage providing means (VP6) to provide a third test voltage between the third and fourth threshold voltages, such as 3 v, during the second half of the read cycle and senses whether the addressed one of the memory cells (C6) is in the conducting state after the third test voltage has been applied thereto to determine a second bit of data stored therein.

In the second embodiment, a fourth test voltage, such as 4.5 v, is provided to the non-addressed ones of the memory cells (C6) so as to turn on the non-addressed ones of the memory cells (C6).

Figures 3, 4:
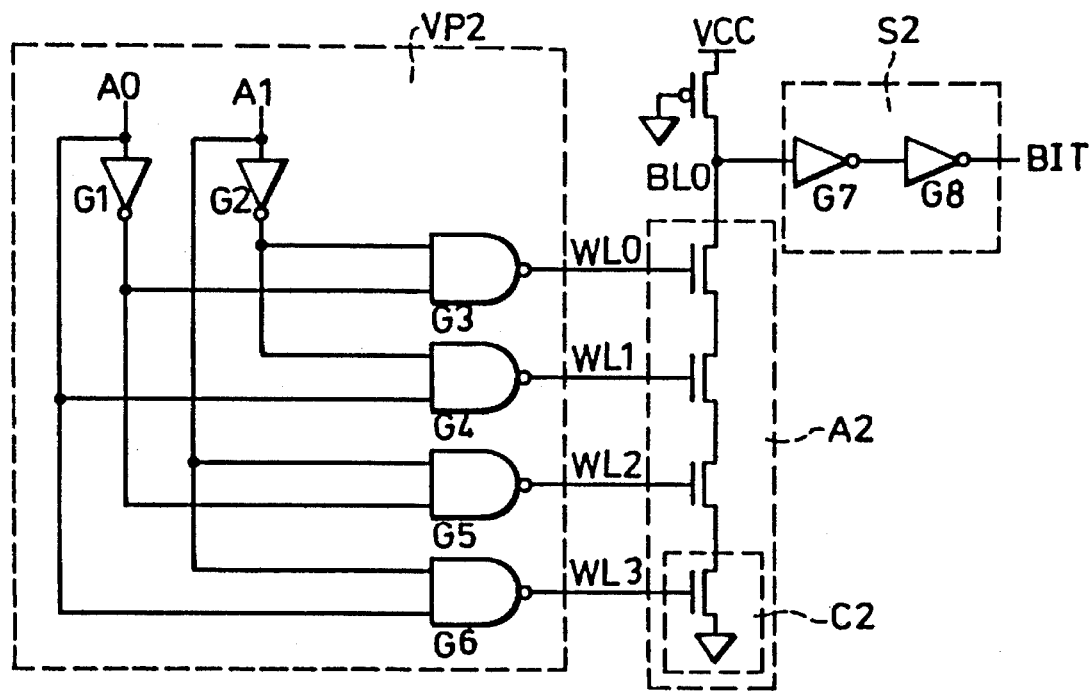
FIG. 3 is a schematic circuit diagram showing a second conventional non-volatile memory device.
FIG. 4 is a table illustrating the characteristics of the transistors employed in the memory device of FIG. 3 when the latter is operated.
Figure 5:
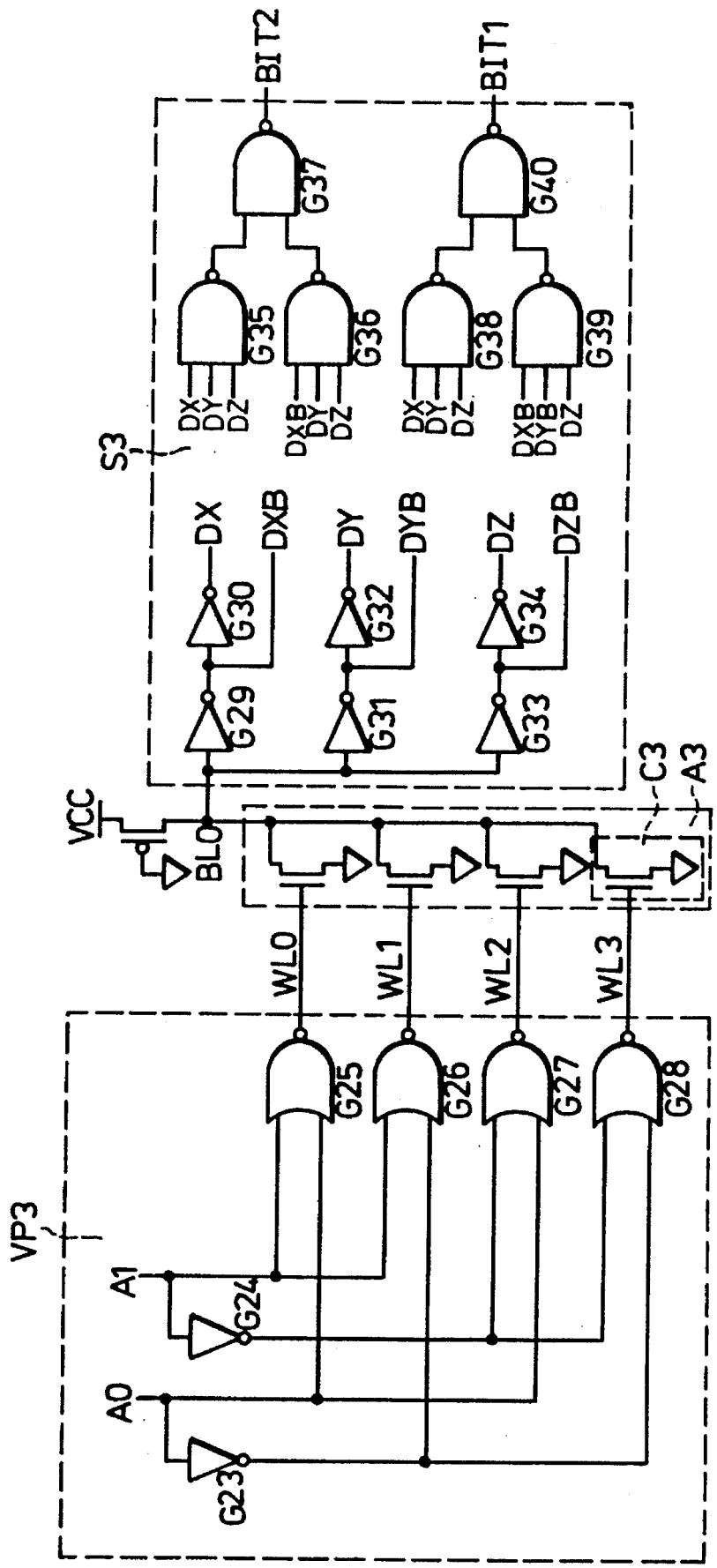
FIG. 5 is a schematic circuit diagram showing a third conventional non-volatile memory device.
Figures 6, 7:
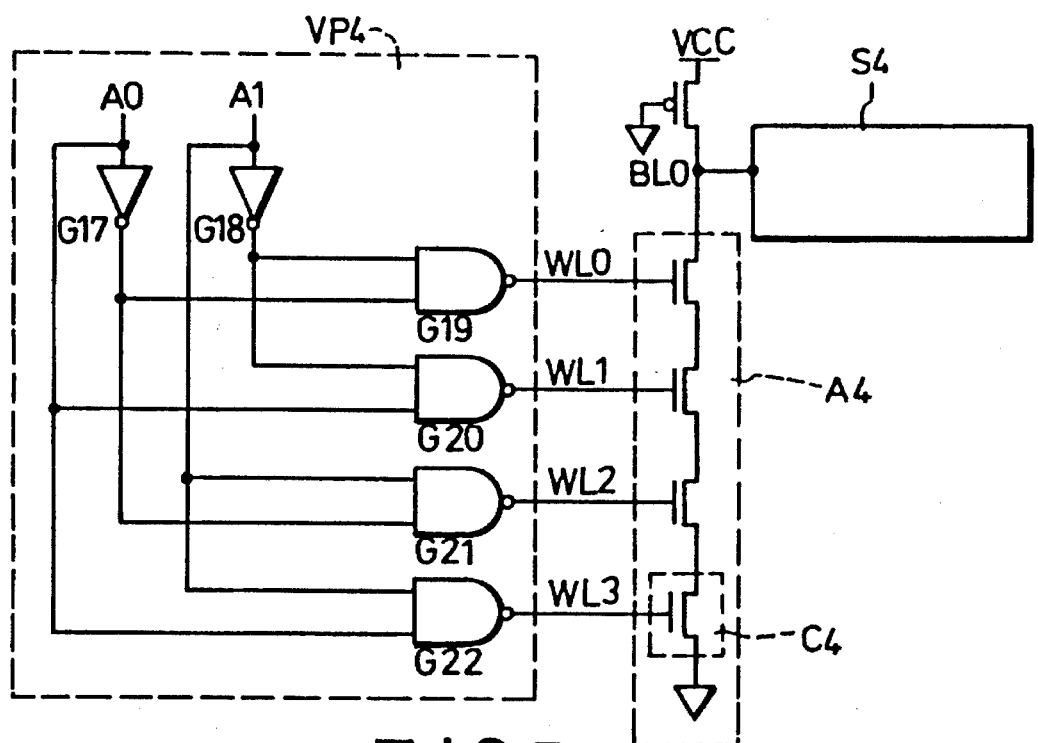
FIG. 6 is a table illustrating the characteristics of the transistors employed in the memory device of FIG. 5 when the latter is operated.
FIG. 7 is a schematic circuit diagram showing a fourth conventional non-volatile memory device.

Accordingly, since the sensing means of the present invention is only used to sense whether the addressed one of the memory cells is in the conducting state, the structure thereof is thus much simpler than those of the sensing means shown in FIGS. 3 and 4.

While the present invention has been described in connection with what is considered the most practical and preferred embodiments, it is understood that this invention is not limited to the disclosed embodiments, but is intended to cover various arrangements included within the spirit and scope of the broadest interpretation so as to encompass all such modifications and equivalent arrangements.

I claim:

1. An apparatus for reading a non-volatile memory array, said memory array including a plurality of memory cells, each of the memory cells storing two-bits of data therein and being formed from one of first, second, third and fourth transistors, said first transistor having a first threshold voltage and corresponding to data bits 00, said second transistor having a second threshold voltage greater than the first threshold voltage and corresponding to data bits 01, said third transistor having a third threshold voltage greater than the second threshold voltage and corresponding to data bits 10, said fourth transistor having a fourth threshold voltage greater than the third threshold voltage and corresponding to data bits 11, said apparatus comprising:

voltage providing means, adapted to be connected to the memory cells, for providing a first test voltage between the second and third threshold voltages to an addressed one of the memory cells; and sensing means, adapted to be connected to the memory cells and to said voltage providing means, for sensing whether the addressed one of the memory cells is in a conducting state after the first test voltage has been applied thereto to determine a first bit of data stored therein;

when the first bit of data stored in said addressed one of the memory cells is 0, said sensing means controlling said voltage providing means to provide a second test voltage between the first and second threshold voltages and sensing whether said addressed one of the memory cells is in the conducting state after the second test voltage has been applied thereto to determine a second bit of data stored therein;

when the first bit of data stored in said addressed one of the memory cells is 1, said sensing means controlling said voltage providing means to provide a third test voltage between the third and fourth threshold voltages and sensing whether said addressed one of the memory cells is in the conducting state after the third test voltage has been applied thereto to determine a second bit of data stored therein.

2. An apparatus as claimed in claim 1, wherein said voltage providing means provides the first test voltage during a first half of a read cycle and provides either of the second and third test voltages during a second half of the read cycle.

3. A non-volatile memory device, comprising:

a non-volatile memory array which includes a plurality of memory cells, each of the memory cells storing two-bits of data therein and being formed from one of first, second, third and fourth transistors, said first transistor having a first threshold voltage and corresponding to data bits 00, said second transistor having a second threshold voltage greater than the first threshold voltage and corresponding to data bits 01, said third transistor having a third threshold voltage greater than the second threshold voltage and corresponding to data bits 10, said fourth transistor having a fourth threshold voltage greater than the third threshold voltage and corresponding to data bits 11; and a reading apparatus including voltage providing means, adapted to be connected to the memory cells, for providing a first test voltage between the second and third threshold voltages to an addressed one of the memory cells, and sensing means, adapted to be connected to the memory cells and to said voltage providing means, for sensing whether the addressed one of the memory cells is in a conducting state after the first test voltage has been applied thereto to determine a first bit of data stored therein;

when the first bit of data stored in said addressed one of said memory cells is 0, said sensing means controlling said voltage providing means to provide a second test voltage between the first and second threshold voltages and sensing whether said addressed one of said memory cells is in the conducting state after the second test voltage has been applied thereto to determine a second bit of data stored therein;

when the first bit of data stored in said addressed one of said memory cells is 1, said sensing means controlling said voltage providing means to provide a third test voltage between the third and fourth threshold voltages and sensing whether said addressed one of the memory cells is in the conducting state after the third test voltage has been applied thereto to determine a second bit of data stored therein.

4. A non-volatile memory device as claimed in claim 3, wherein said memory cells are connected in parallel.

5. A non-volatile memory device as claimed in claim 3, wherein said memory cells are connected in series.

6. A non-volatile memory device as claimed in claim 3, wherein said voltage providing means provides the first test voltage during a first half of a read cycle and provides either of the second and third test voltages during a second half of the read cycle.

* * * * *